(12) United States Patent
Zhou et al.

(10) Patent No.: US 12,724,952 B2
(45) Date of Patent: Sep. 1, 2026

(54) METHOD FOR ESTABLISHING OPTOCOUPLER SPICE MODEL

(71) Applicant: LITE-ON SINGAPORE PTE. LTD., Singapore (SG)

(72) Inventors: Jia Zhou, Singapore (SG); You-Fa Wang, Singapore (SG)

(73) Assignee: LITE-ON SINGAPORE PTE. LTD., Singapore (SG)

( * ) Notice: Subject to any disclaimer, the term of this patent is extended or adjusted under 35 U.S.C. 154(b) by 568 days.

(21) Appl. No.: 18/474,177

(22) Filed: Sep. 25, 2023

(65) Prior Publication Data

US 2024/0119210 A1 Apr. 11, 2024

(30) Foreign Application Priority Data

Oct. 11, 2022 (CN) ......................... 202211240977.1

(51) Int. Cl.
*G06F 30/367* (2020.01)

(52) U.S. Cl.
CPC .................................. *G06F 30/367* (2020.01)

(58) Field of Classification Search
CPC ......... G06F 30/367; G06F 30/30; G06F 30/20
See application file for complete search history.

(56) References Cited

U.S. PATENT DOCUMENTS

2004/0169519 A1 9/2004 Feng
2006/0071237 A1 4/2006 Deboy et al.
2015/0022100 A1 1/2015 Zhang et al.
2022/0222410 A1* 7/2022 Tadakuma ............ G06F 30/367

FOREIGN PATENT DOCUMENTS

CN 1652419 A 8/2005
TW 577017 B 2/2004
TW 201841278 A 11/2018
TW 202226034 A 7/2022

* cited by examiner

*Primary Examiner* — Jack Chiang
*Assistant Examiner* — Rayappu Soundranayagam
(74) *Attorney, Agent, or Firm* — Li & Cai Intellectual Property Office

(57) ABSTRACT

A method for establishing an optocoupler SPICE model includes: establishing at least three performance-state optocoupler SPICE models respectively from optocoupler circuits that correspond to at least three performance states; establishing, according to a maximum performance state, a minimum performance state, and a typical performance state of the at least three performance states that correspond to the at least three performance-state optocoupler SPICE models, three selection circuits for each of an input end and an output end; and correspondingly connecting an input-end first selection circuit, an input-end second selection circuit, an input-end third selection circuit, an output-end first selection circuit, an output-end second selection circuit, and an output-end third selection circuit to two sides of the at least three performance-state optocoupler SPICE models, so as to establish the optocoupler SPICE model.

16 Claims, 6 Drawing Sheets establishing at least three performance-state optocoupler SPICE models respectively from optocoupler circuits that correspond to at least three performance states, in which the at least three performance-state optocoupler SPICE models each include a plurality of performance parameters, and the performance parameters at least include a first performance parameter, a second performance parameter, and a third performance parameter — S110 establishing, according to a maximum performance state, a minimum performance state, and a typical performance state of the at least three performance states that correspond to the at least three performance-state optocoupler SPICE models, three selection circuits for each of an input end and an output end, in which the selection circuits of the input end and the output end include an input-end first selection circuit, an input-end second selection circuit, an input-end third selection circuit, an output-end first selection circuit, an output-end second selection circuit, and an output-end third selection circuit — S120 correspondingly connecting the input-end first selection circuit, the input-end second selection circuit, the input-end third selection circuit, the output-end first selection circuit, the output-end second selection circuit, and the output-end third selection circuit to two sides of the at least three performance-state optocoupler SPICE models, so as to establish an optocoupler SPICE model — S130

FIG. 1

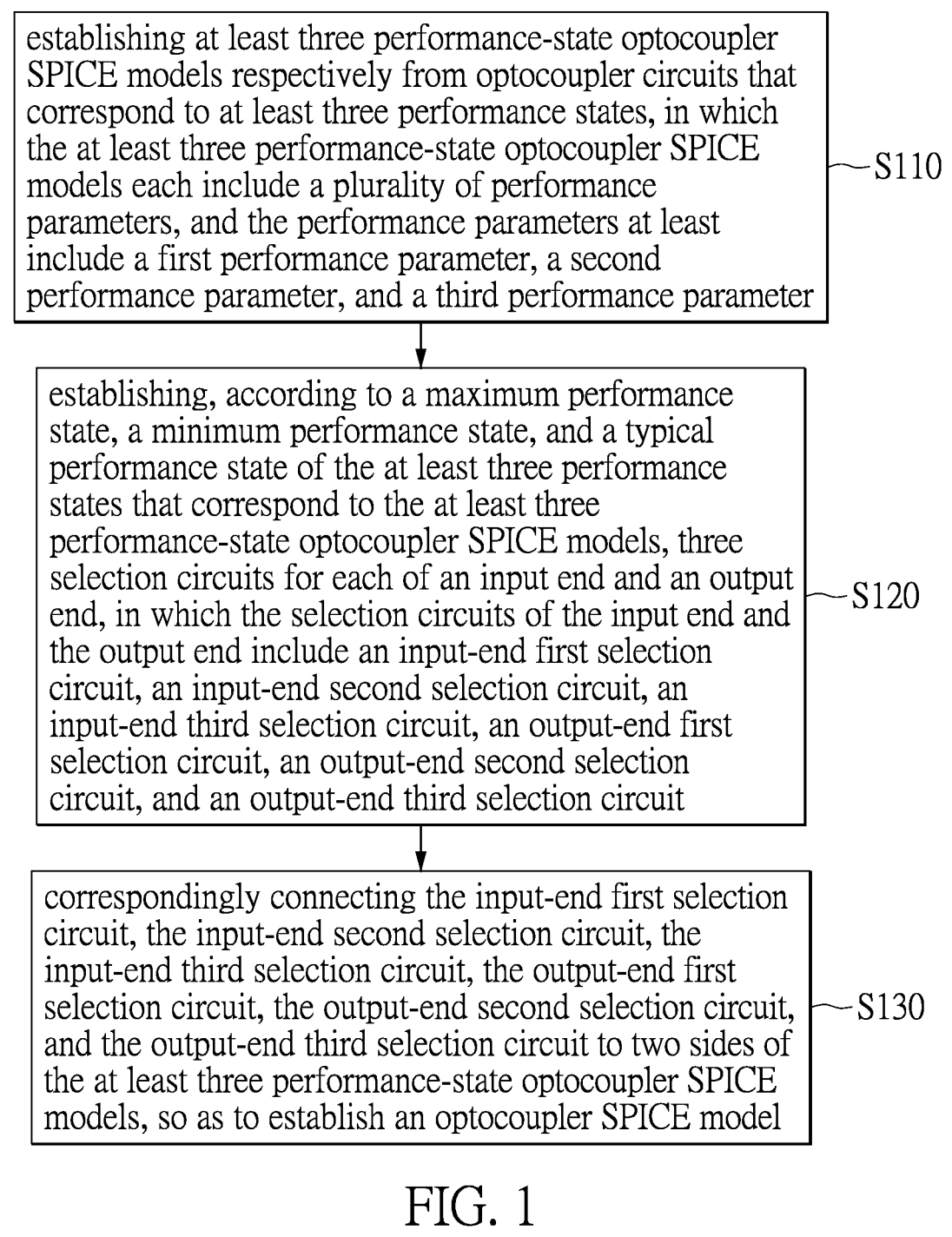

| PARAMETER | | SYMBOL | DATASHEET | | |
|---|---|---|---|---|---|
| | | | MIN | TYP | MAX |
| Input parameter | Forward voltage | $V_F$ | - | 1.35 | 1.8 |
| | Input reverse voltage | $BV_R$ | Min 5V | | |
| | Input threshold current | $I_{TH}$ | - | 0.6mA | 1.3mA |
| | Input capacitance | $C_{IN}$ | | 31pF | |
| Output parameter | High-level supply current | $I_{DDH}$ | - | 0.67mA | 1.0mA |
| | Low-level supply current | $I_{DDL}$ | - | 0.70mA | 1.0mA |
| | High-level output voltage | $V_{OH}$ | $V_{DD}$-0.10V | $V_{DD}$-0.010V | - |
| | | | $V_{DD}$-1.0V | $V_{DD}$-0.17V | - |
| | Low-level output voltage | $V_{OL}$ | - | 0.007V | 0.1V |
| | | | - | 0.14V | 0.4V |
| Switch parameter | Propagation delay to a low output level | $t_{PHL}$ | - | 43ns | 80ns |
| | Propagation delay to a high output level | $t_{PLH}$ | - | 38ns | 80ns |
| | Pulse width distortion | $\|t_{PLH}-t_{PHL}\|$ | - | 5ns | 30ns |
| | Output rise time | $t_r$ | - | 10ns | - |
| | Output fall time | $t_f$ | - | 10ns | - |

FIG. 4

| PARAMETER | | SIMULATION DATA | | | SIMULATION CONDITION |
|---|---|---|---|---|---|
| | | MIN | TYP | MAX | |
| Input parameter | Forward voltage | 1.8V | 1.36V | 1V | $I_F$=2mA |
| | Input reverse voltage | 5V | 5V | 5V | $I_R$=10 μA |
| | Input threshold current | 1.3mA | 0.6mA | 0.5mA | $V_O$<0.8V |
| | Input capacitance | 31pF | 31pF | 31pF | V=0,f=1MHz |
| Output parameter | High-level supply current | 1.0mA | 0.69mA | 0.65mA | $I_F$=0mA, $V_O$=open, $V_{DD}$=5V |
| | Low-level supply current | 0.68mA | 0.68mA | 0.64mA | $I_F$=2mA, $V_O$=open, $V_{DD}$=5V |
| | High-level output voltage | $V_{DD}$-0.1V | $V_{DD}$-0.009V | $V_{DD}$-0.005V | $I_F$=0mA, $I_O$=-20 μA |
| | | $V_{DD}$-1.0V | $V_{DD}$-0.12V | $V_{DD}$-0.09V | $I_F$=0mA, $I_O$=-3.2mA |
| | Low-level output voltage | 0.1V | 0.006V | 0.005V | $I_F$=2mA, $I_O$=-20 μA |
| | | 0.4V | 0.11V | 0.10V | $I_F$=2mA, $I_O$=-3.2mA |
| Switch parameter | Propagation delay to a low output level | 80ns | 45ns | 41ns | $I_F$=2mA, $C_L$=15pF, $V_{DD}$=5V |
| | Propagation delay to a high output level | 50ns | 39ns | 35ns | |
| | Pulse width distortion | 30ns | 6ns | 5ns | |
| | Output rise time | 15ns | 11ns | 9ns | |
| | Output fall time | 15ns | 11ns | 9ns | |

FIG. 5

METHOD FOR ESTABLISHING OPTOCOUPLER SPICE MODEL

CROSS-REFERENCE TO RELATED PATENT APPLICATION

This application claims the benefit of priority to China Patent Application No. 202211240977.1, filed on Oct. 11, 2022 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an optocoupler SPICE model, and more particularly to a method for establishing an optocoupler SPICE model.

BACKGROUND OF THE DISCLOSURE

During a circuit simulation, it is conventional for an optocoupler SPICE ("Simulation Program with Integrated Circuit Emphasis") model to use a typical parameter value as a circuit parameter. However, under this circumstance, a circuit difference caused by a manufacturing error of an optocoupler cannot be detected in a SPICE model simulation.

SUMMARY OF THE DISCLOSURE

In response to the above-referenced technical inadequacy, the present disclosure provides a method for establishing an optocoupler SPICE model.

In order to solve the above-mentioned problem, one of the technical aspects adopted by the present disclosure is to provide a method for establishing an optocoupler SPICE model. The method includes: establishing at least three performance-state optocoupler SPICE models respectively from optocoupler circuits that correspond to at least three performance states, in which the at least three performance-state optocoupler SPICE models each include a plurality of performance parameters, and the performance parameters at least include a first performance parameter, a second performance parameter, and a third performance parameter; establishing, according to a maximum performance state, a minimum performance state, and a typical performance state of the at least three performance states that correspond to the at least three performance-state optocoupler SPICE models, three selection circuits for each of an input end and an output end, in which the selection circuits of the input end and the output end include an input-end first selection circuit, an input-end second selection circuit, an input-end third selection circuit, an output-end first selection circuit, an output-end second selection circuit, and an output-end third selection circuit; and correspondingly connecting the input-end first selection circuit, the input-end second selection circuit, the input-end third selection circuit, the output-end first selection circuit, the output-end second selection circuit, and the output-end third selection circuit to two sides of the at least three performance-state optocoupler SPICE models, so as to establish the optocoupler SPICE model. The first performance parameter is a signal input parameter, the second performance parameter is a signal output parameter, and the third performance parameter is a switch parameter.

Therefore, one of the beneficial effects of the present disclosure is that, in the method for establishing the optocoupler SPICE model provided by the present disclosure, a plurality of maximum parameter values, minimum parameter values, and typical parameter values are included. A circuit simulation can be performed based on a test sequence, such that an efficacy analysis of different performance parameters can be effectively provided, and development expenditures can be effectively reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 1 is a flowchart of a method for establishing an optocoupler SPICE model according to a first embodiment of the present disclosure;

FIG. 4 is a performance parameter table of the optocoupler SPICE model according to the first embodiment of the present disclosure;

FIG. 5 is a data table of a performance parameter simulation of the optocoupler SPICE model according to the first embodiment of the present disclosure.

DETAILED DESCRIPTION OF THE EXEMPLARY EMBODIMENTS

Figure 2:
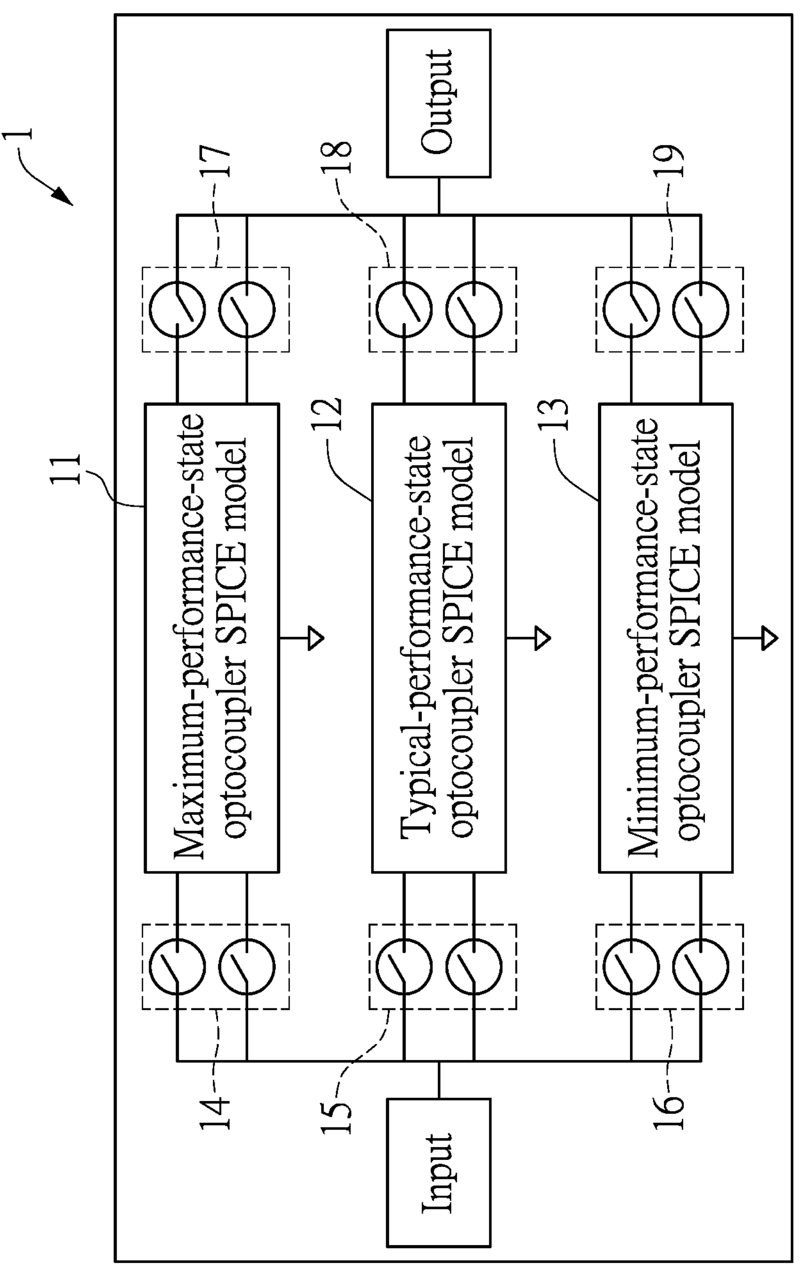
FIG. 2 is a schematic view of the optocoupler SPICE model according to the first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 3:
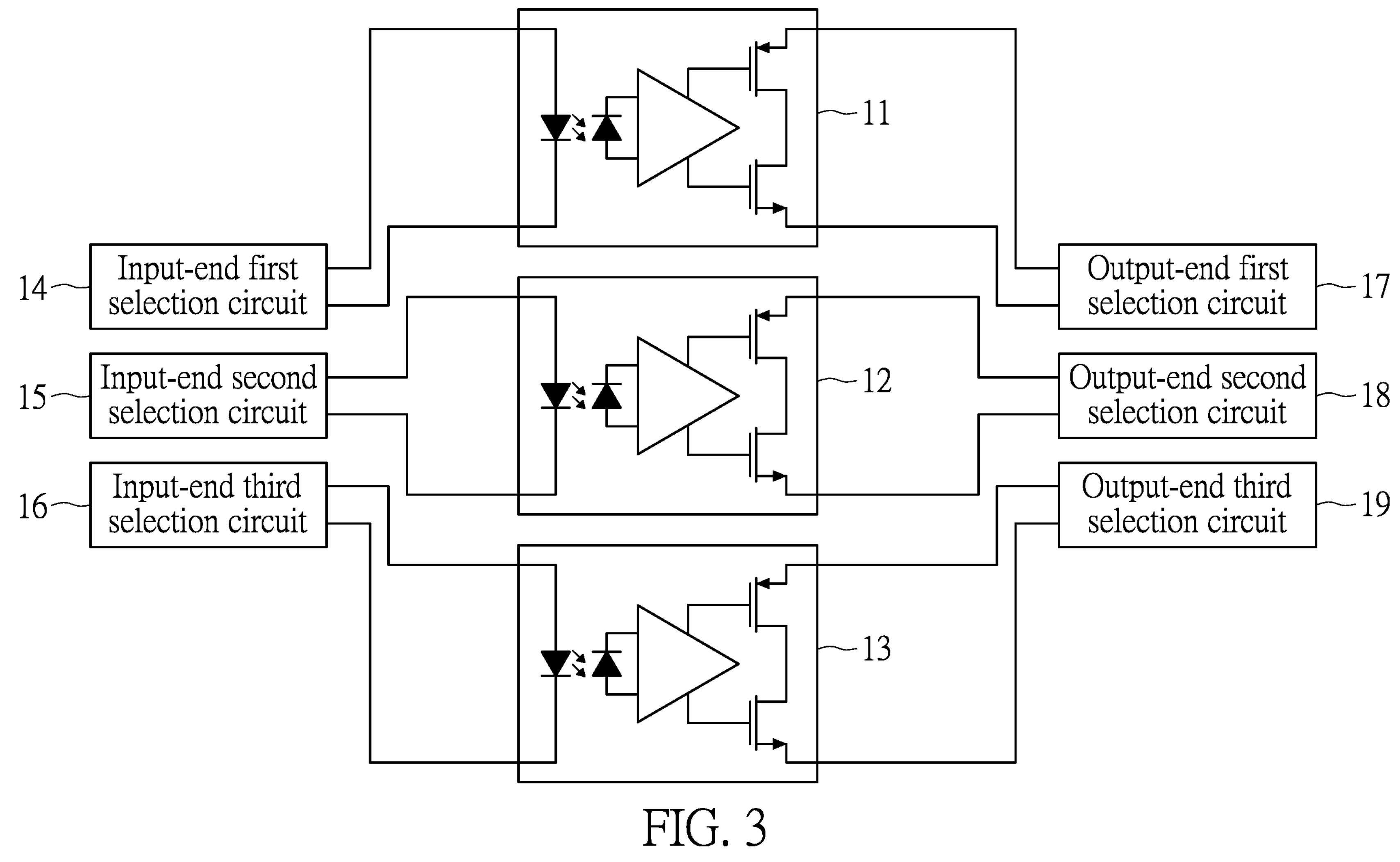
FIG. 3 is another schematic view of the optocoupler SPICE model according to the first embodiment of the present disclosure.
Figure 6:
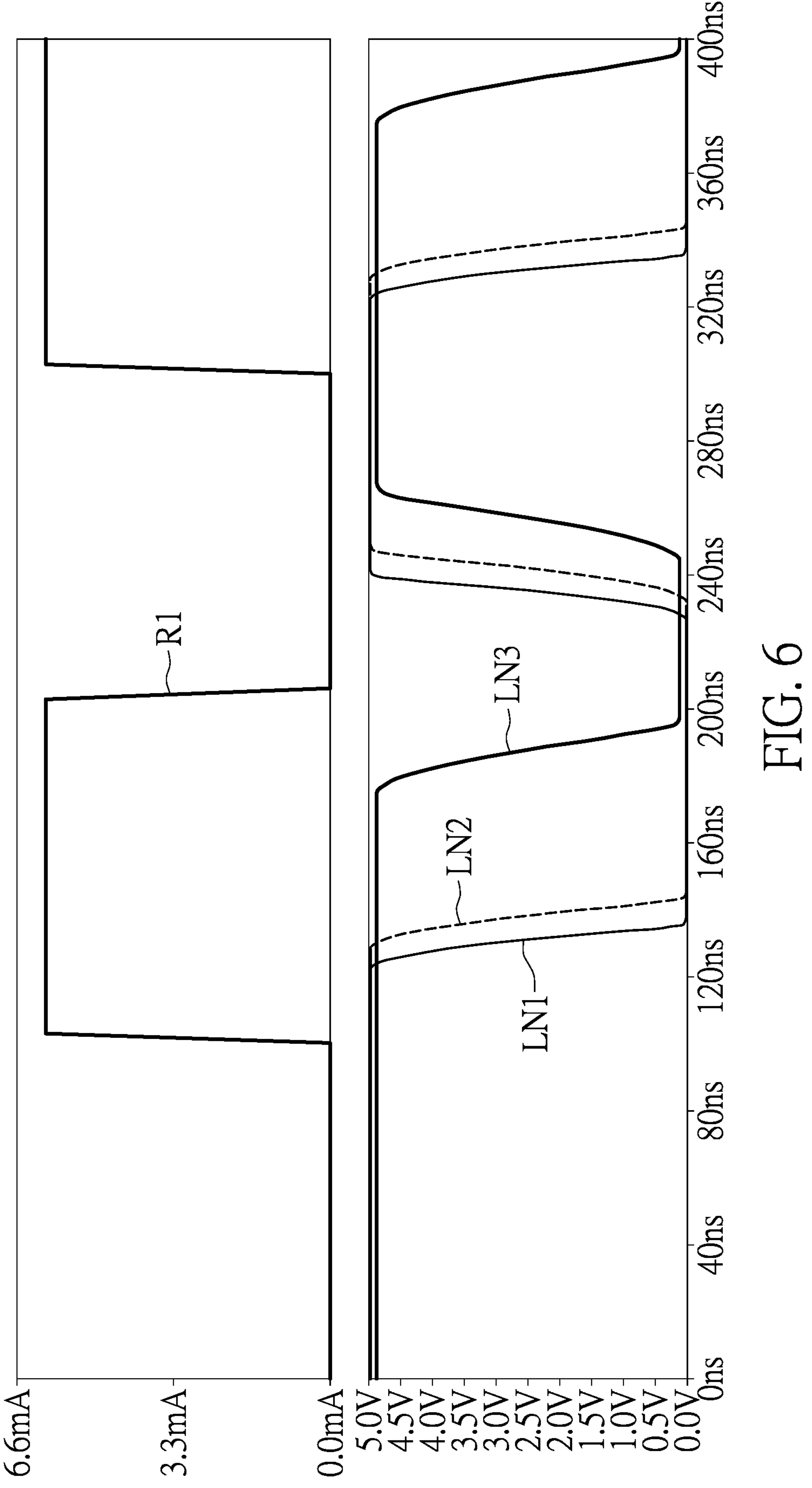
FIG. 6 is a curve diagram of a circuit simulation performed by the optocoupler SPICE model according to the first embodiment of the present disclosure.

Reference is made to FIG. 1 to FIG. 6. FIG. 1 is a flowchart of a method for establishing an optocoupler SPICE model according to a first embodiment of the present disclosure. FIG. 2 is a schematic view of the optocoupler SPICE model according to the first embodiment of the present disclosure. FIG. 3 is another schematic view of the optocoupler SPICE model according to the first embodiment of the present disclosure. FIG. 4 is a performance parameter table of the optocoupler SPICE model according to the first embodiment of the present disclosure. FIG. 5 is a data table of a performance parameter simulation of the optocoupler SPICE model according to the first embodiment of the present disclosure. FIG. 6 is a curve diagram of a circuit simulation performed by the optocoupler SPICE model according to the first embodiment of the present disclosure.

Referring to FIG. 1, the present embodiment provides a method for establishing an optocoupler SPICE model. The method includes steps as follows.

Step S110: establishing at least three performance-state optocoupler SPICE models respectively from optocoupler circuits that correspond to at least three performance states. The at least three performance-state optocoupler SPICE models each include a plurality of performance parameters, and the performance parameters at least include a first performance parameter, a second performance parameter, and a third performance parameter.

Step S120: establishing, according to a maximum performance state, a minimum performance state, and a typical performance state of the at least three performance states that correspond to the at least three performance-state optocoupler SPICE models, three selection circuits for each of an input end and an output end. The selection circuits of the input end and the output end include an input-end first selection circuit, an input-end second selection circuit, an input-end third selection circuit, an output-end first selection circuit, an output-end second selection circuit, and an output-end third selection circuit.

Step S130: correspondingly connecting the input-end first selection circuit, the input-end second selection circuit, the input-end third selection circuit, the output-end first selection circuit, the output-end second selection circuit, and the output-end third selection circuit to two sides of the at least three performance-state optocoupler SPICE models, so as to establish the optocoupler SPICE model.

In step S110, the at least three performance-state optocoupler SPICE models adopt the same circuit signal model (as shown in FIG. 2 and FIG. 3). However, manufacturing errors of components can result in a performance difference of an entire circuit. That is, even with the same circuit structure, there are still differences in terms of achieved performances. Hence, as shown in FIG. 4 and FIG. 5, each performance parameter generally includes a typical performance parameter value (typ), a maximum performance parameter value (max), and a minimum performance parameter value (min).

Further, in the present embodiment, the multiple performance states selected by the optocoupler circuits at least include the first performance parameter, the second performance parameter, and the third performance parameter. In the present embodiment, the first performance parameter is a signal input parameter, the second performance parameter is a signal output parameter, and the third performance parameter is a switch parameter. In other embodiments, other performance parameters can be selected and taken into consideration for a circuit model. A quantity of the selected performance parameters can also be adjusted according to practical requirements. That is, based on the selected performance parameters, each performance state can be combined for formation of different performance states.

As shown in FIG. 4, the first performance parameter, the second performance parameter, and the third performance parameter include a forward voltage, an input reverse voltage, an input threshold current, an input capacitance, a high-level supply current, a low-level supply current, a high-level output voltage, a low-level output voltage, a propagation delay to a low output level, a propagation delay to a high output level, a pulse width distortion, an output rise time, or an output fall time.

That is, the first performance parameter, the second performance parameter, and the third performance parameter can be selected from the above-mentioned performance parameters.

In addition, the multiple first performance parameters of the three performance-state optocoupler SPICE models include a maximum first performance parameter, a minimum first performance parameter, and a typical first performance parameter. As shown in FIG. 5, each parameter includes multiple pieces of simulation data. That is, each performance parameter includes its maximum parameter value, its typical parameter value, and its minimum parameter value.

Referring to FIG. 2 and FIG. 3, the three performance-state optocoupler SPICE models (11-13) in the present embodiment are a maximum-performance-state optocoupler SPICE model, a typical-performance-state optocoupler SPICE model, and a minimum-performance-state optocoupler SPICE model, respectively. The multiple first performance parameters of the maximum-performance-state optocoupler SPICE model include more than one maximum first performance parameter. The multiple first performance parameters of the minimum-performance-state optocoupler SPICE model include more than one minimum first performance parameter. The multiple first performance parameters of the typical-performance-state optocoupler SPICE model include more than one typical first performance parameter.

The multiple second performance parameters of the maximum-performance-state optocoupler SPICE model include more than one maximum second performance parameter. The multiple second performance parameters of the minimum-performance-state optocoupler SPICE model include more than one minimum second performance parameter. The multiple second performance parameters of the typical-performance-state optocoupler SPICE model include more than one typical second performance parameter.

The multiple third performance parameters of the maximum-performance-state optocoupler SPICE model include more than one maximum third performance parameter. The multiple third performance parameters of the minimumperformance-state optocoupler SPICE model include more than one minimum third performance parameter. The multiple third performance parameters of the typical-performance-state optocoupler SPICE model include more than one typical third performance parameter.

That is, the first performance parameter, the second performance parameter, and the third performance parameter can be selected. Then, based on the selected first performance parameter, the selected second performance parameter, and the selected third performance parameter, three types of performance parameter values in manufacturing errors are respectively provided.

The first performance parameter includes the maximum first performance parameter, the minimum first performance parameter, and the typical first performance parameter. The second performance parameter includes the maximum second performance parameter, the minimum second performance parameter, and the typical second performance parameter. The third performance parameter includes the maximum third performance parameter, the minimum third performance parameter, and the typical third performance parameter. That is, each of the selected performance parameter values includes the maximum parameter value, the minimum parameter value, and the typical parameter value. The typical parameter value can be a mean, a median, or any other statistical value.

In step S110, the maximum parameter value, the minimum parameter value, and the typical parameter value of each of the above-mentioned first performance parameter, second performance parameter, and third performance parameter are respectively used to establish the three performance-state optocoupler SPICE models (i.e., a maximum-performance-state optocoupler SPICE model 11, a minimum-performance-state optocoupler SPICE model 13, and a typical-performance-state optocoupler SPICE model 12). The optocoupler circuits of the above-mentioned three performance parameters include multiple maximum performance parameters, multiple minimum performance parameters, and multiple typical performance parameters, respectively.

Reference is made to FIG. 3. In step S220, according to the three performance states of the three performance-state optocoupler SPICE models (11-13), the three selection circuits for each of the input end and the output end are established, so as to establish respective SPICE models. The selection circuits include an input-end first selection circuit 14, an input-end second selection circuit 15, an input-end third selection circuit 16, an output-end first selection circuit 17, an output-end second selection circuit 18, and an output-end third selection circuit 19.

In the present embodiment, the SPICE models of the input-end first selection circuit 14, the input-end second selection circuit 15, the input-end third selection circuit 16, the output-end first selection circuit 17, the output-end second selection circuit 18, and the output-end third selection circuit 19 each include a selection condition. In the present embodiment, since the input-end first selection circuit 14 and the output-end first selection circuit 17 are connected to the input end and the output end of the maximum-performance-state optocoupler SPICE model 11, the input-end first selection circuit 14 and the output-end first selection circuit 17 can be designated with the same selection condition for synchronization of actions. Similarly, since the input-end second selection circuit 15 and the output-end second selection circuit 18 are connected to the input end and the output end of the typical-performance-state optocoupler SPICE model 12, the input-end second selection circuit 15 and the output-end second selection circuit 18 can be designated with the same selection condition for synchronization of actions. Since the input-end third selection circuit 16 and the output-end third selection circuit 19 are connected to the input end and the output end of the minimum-performance-state optocoupler SPICE model 13, the input-end third selection circuit 16 and the output-end third selection circuit 19 can be designated with the same selection condition for synchronization of actions.

Reference is made to FIG. 3. In step S130, the actions of the input-end first selection circuit 14 and the output-end first selection circuit 17 are synchronized, the actions of the input-end second selection circuit 15 and the output-end second selection circuit 18 are synchronized, and the actions of the input-end third selection circuit 16 and the output-end third selection circuit 19 are synchronized. As shown in FIG. 3, the input-end first selection circuit 14, the input-end second selection circuit 15, and the input-end third selection circuit 16 are disposed at one side of the three performance-state optocoupler SPICE models (11-13). The output-end first selection circuit 17, the output-end second selection circuit 18, and the output-end third selection circuit 19 are disposed at another side of the three performance-state optocoupler SPICE models (11-13). The input-end first selection circuit 14, the input-end second selection circuit 15, the input-end third selection circuit 16, the output-end first selection circuit 17, the output-end second selection circuit 18, and the output-end third selection circuit 19 are correspondingly connected to pins at the two sides of the three performance-state optocoupler SPICE models (11-13).

As such, based on a selection sequence of the different selection conditions of the selection circuits (14-19), the three performance-state optocoupler SPICE models (11-13) can make a selection and perform a circuit simulation.

In the present embodiment, the circuit simulation is performed based on a test sequence. The maximum-performance-state optocoupler SPICE model 11 (which is generated in response to the maximum first performance parameter, the maximum second performance parameter, and the maximum third performance parameter), the minimum-performance-state optocoupler SPICE model 13 (which is generated in response to the minimum first performance parameter, the minimum second performance parameter, and the minimum third performance parameter), and the typical-performance-state optocoupler SPICE model 12 (which is generated in response to the typical first performance parameter, the typical second performance parameter, and the typical third performance parameter) can perform testing based on the test sequence. For example, the testing is carried out based on the test sequence of the maximum performance state, the typical performance state, and the minimum performance state, or is carried out based on the test sequence of the typical performance state, the maximum performance state, and the minimum performance state. In the present embodiment, the selection sequence of the selection circuits (14-19) can be tested based on the test sequence of the first performance parameter, the second performance parameter, and the third performance parameter.

In the present embodiment, the three performance-state optocoupler SPICE models (11-13) that include multiple performance parameter values are established. When an optocoupler SPICE model 1 is disposed in a circuit system, the optocoupler SPICE model 1 can run a circuit simulation program based on the test sequence of the input-end first selection circuit 14 and the output-end first selection circuit 17, the input-end second selection circuit 15 and the output-end second selection circuit 18, and the input-end third selection circuit 16 and the output-end third selection circuit 19.

Referring to FIG. 6, a curve R1 in the diagram is a curve of an input signal. A curve LN1, a curve LN2, and a curve LN3 are performance curves of simulations run by the maximum-performance-state optocoupler SPICE model 11, the minimum-performance-state optocoupler SPICE model 13, and the typical-performance-state optocoupler SPICE model 12, respectively. It can be observed from FIG. 6 that the different performance-state optocoupler SPICE models (11-13) display different performance curves during the circuit simulation.

Beneficial Effects of the Embodiment

In conclusion, one of the beneficial effects of the present disclosure is that, the optocoupler SPICE model provided in the present disclosure includes multiple ones of the maximum parameter value, the minimum parameter value, and the typical parameter value. The circuit simulation can be performed based on the test sequence, such that an efficacy analysis of different performance states can be effectively provided, and development expenditures can be effectively reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method for establishing an optocoupler SPICE model, comprising:

establishing at least three performance-state optocoupler SPICE models respectively from optocoupler circuits that correspond to at least three performance states, wherein the at least three performance-state optocoupler SPICE models each include a plurality of performance parameters, and the performance parameters at least include a first performance parameter, a second performance parameter, and a third performance parameter;

establishing, according to a maximum performance state, a minimum performance state, and a typical performance state of the at least three performance states that correspond to the at least three performance-state optocoupler SPICE models, three selection circuits for each of an input end and an output end; wherein the selection circuits of the input end and the output end include an input-end first selection circuit, an input-end second selection circuit, an input-end third selection circuit, an output-end first selection circuit, an output-end second selection circuit, and an output-end third selection circuit; and correspondingly connecting the input-end first selection circuit, the input-end second selection circuit, the input-end third selection circuit, the output-end first selection circuit, the output-end second selection circuit, and the output-end third selection circuit to two sides of the at least three performance-state optocoupler SPICE models, so as to establish the optocoupler SPICE model.

2. The method according to claim 1, wherein the first performance parameter is a signal input parameter, the second performance parameter is a signal output parameter, and the third performance parameter is a switch parameter.

3. The method according to claim 2, wherein the first performance parameter of the at least three performance-state optocoupler SPICE models includes a maximum first performance parameter, a minimum first performance parameter, and a typical first performance parameter; wherein the second performance parameter of the at least three performance-state optocoupler SPICE models includes a maximum second performance parameter, a minimum second performance parameter, and a typical second performance parameter; wherein the third performance parameter of the at least three performance-state optocoupler SPICE models includes a maximum third performance parameter, a minimum third performance parameter, and a typical third performance parameter.

4. The method according to claim 3, wherein a turn-on or turn-off selection is made based on a selection sequence of the input-end first selection circuit, the input-end second selection circuit, the input-end third selection circuit, the output-end first selection circuit, the output-end second selection circuit, and the output-end third selection circuit, and the selection sequence is determined based on a test sequence of the first performance parameter, the second performance parameter, and the third performance parameter.

5. The method according to claim 4, wherein the test sequence of the input-end first selection circuit, the input-end second selection circuit, the input-end third selection circuit, the output-end first selection circuit, the output-end second selection circuit, and the output-end third selection circuit is determined based on the maximum first performance parameter, the minimum first performance parameter, and the typical first performance parameter of the first performance parameter, the maximum second performance parameter, the minimum second performance parameter, and the typical second performance parameter of the second performance parameter, and the maximum third performance parameter, the minimum third performance parameter, and the typical third performance parameter of the third performance parameter.

6. The method according to claim 5, wherein, when the optocoupler SPICE model is disposed in a circuit system, the optocoupler SPICE model runs a circuit simulation program based on the test sequence of the input-end first selection circuit, the input-end second selection circuit, the input-end third selection circuit, the output-end first selection circuit, the output-end second selection circuit, and the output-end third selection circuit.

7. The method according to claim 2, wherein the first performance parameter, the second performance parameter, and the third performance parameter selectively include a forward voltage, an input reverse voltage, an input threshold current, a high-level supply current, a low-level supply current, a propagation delay to a low output level, a propagation delay to a high output level, an output rise time, or an output fall time.

8. The method according to claim 7, wherein the first performance parameter, the second performance parameter, and the third performance parameter further include at least following performance parameters: an input capacitance, a high-level output voltage, a low-level output voltage, and a pulse width distortion.

9. A method for establishing an optocoupler SPICE model, comprising:

establishing at least three performance-state optocoupler SPICE models respectively from optocoupler circuits that correspond to at least three performance states, wherein the at least three performance-state optocoupler SPICE models each include a plurality of performance parameters, and the performance parameters at least include a first performance parameter, a second performance parameter, and a third performance parameter;

establishing, according to a maximum performance state, a minimum performance state, and a typical performance state of the at least three performance states that correspond to the at least three performance-state optocoupler SPICE models, three selection circuits for each of an input end and an output end; wherein the selection circuits of the input end and the output end include an input-end first selection circuit, an input-end second selection circuit, an input-end third selection circuit, an output-end first selection circuit, an output-end second selection circuit, and an output-end third selection circuit; and correspondingly connecting the input-end first selection circuit, the input-end second selection circuit, the input-end third selection circuit, the output-end first selection circuit, the output-end second selection circuit, and the output-end third selection circuit to two sides of the at least three performance-state optocoupler SPICE models;

wherein a turn-on or turn-off selection is made based on a selection sequence of the input-end first selection circuit, the input-end second selection circuit, the input-end third selection circuit, the output-end first selection circuit, the output-end second selection circuit, and the output-end third selection circuit, and the selection sequence is determined based on a test sequence of the first performance parameter, the second performance parameter, and the third performance parameter.

10. The method according to claim 9, wherein the first performance parameter, the second performance parameter, and the third performance parameter selectively include a forward voltage, an input reverse voltage, an input threshold current, an input capacitance, a high-level supply current, a low-level supply current, a high-level output voltage, a low-level output voltage, a propagation delay to a low output level, a propagation delay to a high output level, a pulse width distortion, an output rise time, or an output fall time.

11. The method according to claim 9, wherein the first performance parameter of the at least three performance-state optocoupler SPICE models includes a maximum first performance parameter, a minimum first performance parameter, and a typical first performance parameter; wherein the second performance parameter of the at least three performance-state optocoupler SPICE models includes a maximum second performance parameter, a minimum second performance parameter, and a typical second performance parameter; wherein the third performance parameter of the at least three performance-state optocoupler SPICE models includes a maximum third performance parameter, a minimum third performance parameter, and a typical third performance parameter.

12. The method according to claim 11, wherein the test sequence of the input-end first selection circuit, the input-end second selection circuit, the input-end third selection circuit, the output-end first selection circuit, the output-end second selection circuit, and the output-end third selection circuit is determined based on the maximum first performance parameter, the minimum first performance parameter, and the typical first performance parameter of the first performance parameter, the maximum second performance parameter, the minimum second performance parameter, and the typical second performance parameter of the second performance parameter, and the maximum third performance parameter, the minimum third performance parameter, and the typical third performance parameter of the third performance parameter.

13. A method for establishing an optocoupler SPICE model, comprising:

establishing at least three performance-state optocoupler SPICE models respectively from optocoupler circuits that correspond to at least three performance states, wherein the at least three performance-state optocoupler SPICE models each include a plurality of performance parameters selectively from a forward voltage, an input reverse voltage, an input threshold current, an input capacitance, a high-level supply current, a low-level supply current, a high-level output voltage, a low-level output voltage, a propagation delay to a low output level, a propagation delay to a high output level, a pulse width distortion, an output rise time, or an output fall time;

establishing, according to a maximum performance state, a minimum performance state, and a typical performance state of the at least three performance states that correspond to the at least three performance-state optocoupler SPICE models, three selection circuits for each of an input end and an output end; wherein the selection circuits of the input end and the output end include an input-end first selection circuit, an input-end second selection circuit, an input-end third selection circuit, an output-end first selection circuit, an output-end second selection circuit, and an output-end third selection circuit; and correspondingly connecting the input-end first selection circuit, the input-end second selection circuit, the input-end third selection circuit, the output-end first selection circuit, the output-end second selection circuit, and the output-end third selection circuit to two sides of the at least three performance-state optocoupler SPICE models, so as to establish the optocoupler SPICE model.

14. The method according to claim 13, wherein, when the optocoupler SPICE model is disposed in a circuit system, the optocoupler SPICE model runs a circuit simulation program based on a test sequence of the input-end first selection circuit, the input-end second selection circuit, the input-end third selection circuit, the output-end first selection circuit, the output-end second selection circuit, and the output-end third selection circuit.

15. The method according to claim 14, wherein the performance parameters include a set of first performance parameters that include a maximum first performance parameter, a minimum first performance parameter, and a typical first performance parameter, a set of second performance parameters that include a maximum second performance parameter, a minimum second performance parameter, and a typical second performance parameter, and a set of third performance parameters that include a maximum third performance parameter, a minimum third performance parameter, and a typical third performance parameter.

16. The method according to claim 15, wherein the test sequence of the input-end first selection circuit, the input-end second selection circuit, the input-end third selection circuit, the output-end first selection circuit, the output-end second selection circuit, and the output-end third selection circuit is determined based on the maximum first performance parameter, the minimum first performance parameter, and the typical first performance parameter of the set of first performance parameters, the maximum second performance parameter, the minimum second performance parameter, and the typical second performance parameter of the set of the second performance parameters, and the maximum third performance parameter, the minimum third performance parameter, and the typical third performance parameter of the set of third performance parameters.

* * * * *